(12) United States Patent
Yuen

(10) Patent No.: US 12,025,650 B2
(45) Date of Patent: *Jul. 2, 2024

(54) TESTING APPARATUS FOR OPTICAL DEVICES

(71) Applicant: Lumentum Operations LLC, San Jose, CA (US)

(72) Inventor: Albert Yuen, Palo Alto, CA (US)

(73) Assignee: Lumentum Operations LLC, San Jose, CA (US)

( * ) Notice: Subject to any disclaimer, the term of this patent is extended or adjusted under 35 U.S.C. 154(b) by 197 days.

This patent is subject to a terminal disclaimer.

(21) Appl. No.: 17/581,092

(22) Filed: Jan. 21, 2022

(65) Prior Publication Data

US 2022/0146567 A1 May 12, 2022

Related U.S. Application Data

(63) Continuation of application No. 16/822,487, filed on Mar. 18, 2020, now Pat. No. 11,231,452.

(60) Provisional application No. 62/969,908, filed on Feb. 4, 2020.

(51) Int. Cl.
  *G01R 31/26* (2020.01)
(52) U.S. Cl.
  CPC ..... *G01R 31/2635* (2013.01); *G01R 31/2601* (2013.01)
(58) Field of Classification Search
  CPC . G01R 1/02; G01R 1/04; G01R 31/00; G01R 31/26; G01R 31/2635; G01R 31/2601; G01R 31/2642; G01R 31/28; G01R 1/0491; G01R 31/318505; G01R 31/311
  See application file for complete search history.

(56) References Cited

U.S. PATENT DOCUMENTS

| | | | |
|---|---|---|---|
| 5,515,167 A | 5/1996 | Ledger et al. | |
| 6,504,615 B1 | 1/2003 | Abe et al. | |
| 6,775,000 B2 | 8/2004 | Harrison et al. | |
| 11,231,452 B2 | 1/2022 | Yuen | |
| 2002/0106848 A1 | 8/2002 | Wack et al. | |
| 2002/0109520 A1 | 8/2002 | Heald et al. | |

(Continued)

FOREIGN PATENT DOCUMENTS

| | | |
|---|---|---|
| JP | H04280445 A | 10/1992 |
| JP | 2009170730 A | 7/2009 |

*Primary Examiner* — Son T Le

(74) *Attorney, Agent, or Firm* — Harrity & Harrity, LLP

(57) ABSTRACT

An apparatus may include an upper transparent plate to hold a wafer of bottom-emitting or bottom-detecting optical devices, wherein the upper transparent plate comprises a set of holes in an area of the upper transparent plate for holding the wafer. The apparatus may include a lower transparent plate and a structure supporting the upper transparent plate and the lower transparent plate to form a cavity bounded by the upper transparent plate, the lower transparent plate, and the structure, wherein the structure comprises an opening in fluid communication with the cavity, wherein applying suction through the opening, via the cavity and the set of holes, holds the wafer flat on the upper transparent plate, and wherein an optical path, between a bottom-emitting or bottom-detecting optical device of the bottom-emitting or bottom-detecting optical devices of the wafer and a testing device, passes through the upper transparent plate, the cavity, and the lower transparent plate.

20 Claims, 4 Drawing Sheets

(56) References Cited

U.S. PATENT DOCUMENTS

| | | |
|---|---|---|
| 2003/0042889 A1 | 3/2003 | Harris et al. |
| 2013/0050468 A1 | 2/2013 | Golan et al. |
| 2013/0169283 A1 | 7/2013 | Lagowski et al. |
| 2021/0156891 A1 | 5/2021 | Kobayashi et al. |
| 2021/0156903 A1 | 5/2021 | Chuang et al. |
| 2021/0156907 A1 | 5/2021 | Chuang et al. |

TESTING APPARATUS FOR OPTICAL DEVICES

RELATED APPLICATION

This application is a continuation of U.S. patent application Ser. No. 16/822,487, filed Mar. 18, 2020 (now U.S. Pat. No. 11,231,452), which claims priority to U.S. Provisional Patent Application No. 62/969,908 for a "Transparent Wafer Carrier for Use in Testing System for Bottom-Emitting Optical Device," filed on Feb. 4, 2020, the contents of which are incorporated herein by reference in their entireties.

TECHNICAL FIELD

The present disclosure relates generally to testing apparatuses for optical devices, and more particularly, to a testing apparatus for bottom-emitting optical devices, bottom-detecting optical devices, and/or the like.

BACKGROUND

Testing apparatuses for wafers of devices may include an upper chuck for holding a wafer and a lower chuck positioned below the upper chuck such that a gap or a cavity is formed between the upper chuck and the lower chuck. The upper chuck may include a set of holes such that when a vacuum or suction is applied to the cavity the wafer is held in place on and/or flattened onto the upper chuck. To withstand the forces of the vacuum applied to the cavity and to enable efficient heat transfer, the upper chuck and the lower chuck may be made of metal materials such as aluminum, steel, and/or the like. While the wafer is held in place on the upper chuck, devices on the wafer may be probed or tested.

A wafer carrier or carrier plate may be used to transport the wafer to the testing apparatus. For example, the wafer may be positioned on a wafer carrier, and the wafer carrier and the wafer may be transported from a cassette of wafers on wafer carriers to the testing apparatus. When placed on the testing apparatus, the wafer carrier may be positioned between the wafer and the upper chuck. When a vacuum is applied to the cavity, the wafer carrier and the wafer may be held in place on and/or flattened onto the upper chuck, and optical devices on the wafer may be probed or tested.

Optical devices may include optical emitters (e.g., semiconductor laser diodes, semiconductor light-emitting diodes, and/or the like) and optical detectors (e.g., photodetectors, such as photodiodes, photovoltaic cells, active-pixel sensors, and/or the like). Additionally, optical devices may be top-emitting, top-detecting, bottom-emitting, or bottom-detecting. For example, a vertical-cavity surface-emitting laser (VCSEL) is a type of semiconductor laser diode with laser beam emission perpendicular to the top surface of the semiconductor substrate. VCSELs may be a top-emitting or bottom-emitting. A top-emitting VCSEL is a laser in which a laser beam is emitted from a top surface without passing through the semiconductor substrate). A bottom-emitting VCSEL is a laser in which a laser beam is emitted through the semiconductor substrate. Top-emitting and bottom-emitting VCSEL devices may allow for testing to occur at intermediate steps of wafer fabrication. Top-detecting and bottom-detecting optical devices on a wafer are similar to top-emitting and bottom-emitting optical devices except that they receive light and generate a response (e.g., an electrical signal) instead of emitting light in response to an electrical signal.

SUMMARY

According to some implementations, an apparatus may include an upper transparent plate to hold a wafer of bottom-emitting or bottom-detecting optical devices, wherein the upper transparent plate comprises a set of holes in an area of the upper transparent plate for holding the wafer; a lower transparent plate; and a structure supporting the upper transparent plate and the lower transparent plate to form a cavity bounded by the upper transparent plate, the lower transparent plate, and the structure, wherein the structure comprises an opening in fluid communication with the cavity, wherein applying suction through the opening, via the cavity and the set of holes, holds the wafer flat on the upper transparent plate, and wherein an optical path, between a bottom-emitting or bottom-detecting optical device of the bottom-emitting or bottom-detecting optical devices of the wafer and a testing device, passes through the upper transparent plate, the cavity, and the lower transparent plate, and wherein the upper transparent plate and the lower transparent plate are transparent at a wavelength for optical testing of the bottom-emitting or bottom-detecting optical devices.

According to some implementations, an apparatus may include a transparent wafer carrier to hold a wafer of bottom-emitting or bottom-detecting optical devices, wherein the transparent wafer carrier comprises a set of holes in an area of the transparent wafer carrier for holding the wafer; a lower transparent plate; and a structure supporting the transparent wafer carrier and the lower transparent plate to form a cavity bounded by the transparent wafer carrier, the lower transparent plate, and the structure, wherein the structure comprises an opening in fluid communication with the cavity, wherein applying suction through the opening, via the cavity and the set of holes, holds the wafer flat on the transparent wafer carrier, and wherein an optical path, between a bottom-emitting or bottom-detecting optical device of the bottom-emitting or bottom-detecting optical devices of the wafer and a testing device, passes through the transparent wafer carrier, the cavity, and the lower transparent plate.

According to some implementations, a method may include positioning an upper plate on a structure to form a cavity bounded by the upper plate, a lower plate, and the structure, wherein the upper plate comprises a set of holes in fluid communication with the cavity; positioning the optical wafer on the upper plate over the set of holes; applying, after positioning the upper plate and positioning the optical wafer, vacuum through an opening of the structure to create suction, via the cavity and the set of holes, thereby holding the optical wafer flat on the upper plate; and performing, after applying vacuum and by a testing device, at least one of detecting light traveling from the optical wafer through the upper plate and the lower plate or emitting light through the lower plate and the upper plate to the optical wafer; wherein the upper plate and the lower plate are transparent for the light travelling to or emitted from the optical wafer.

DETAILED DESCRIPTION

Figure 1:
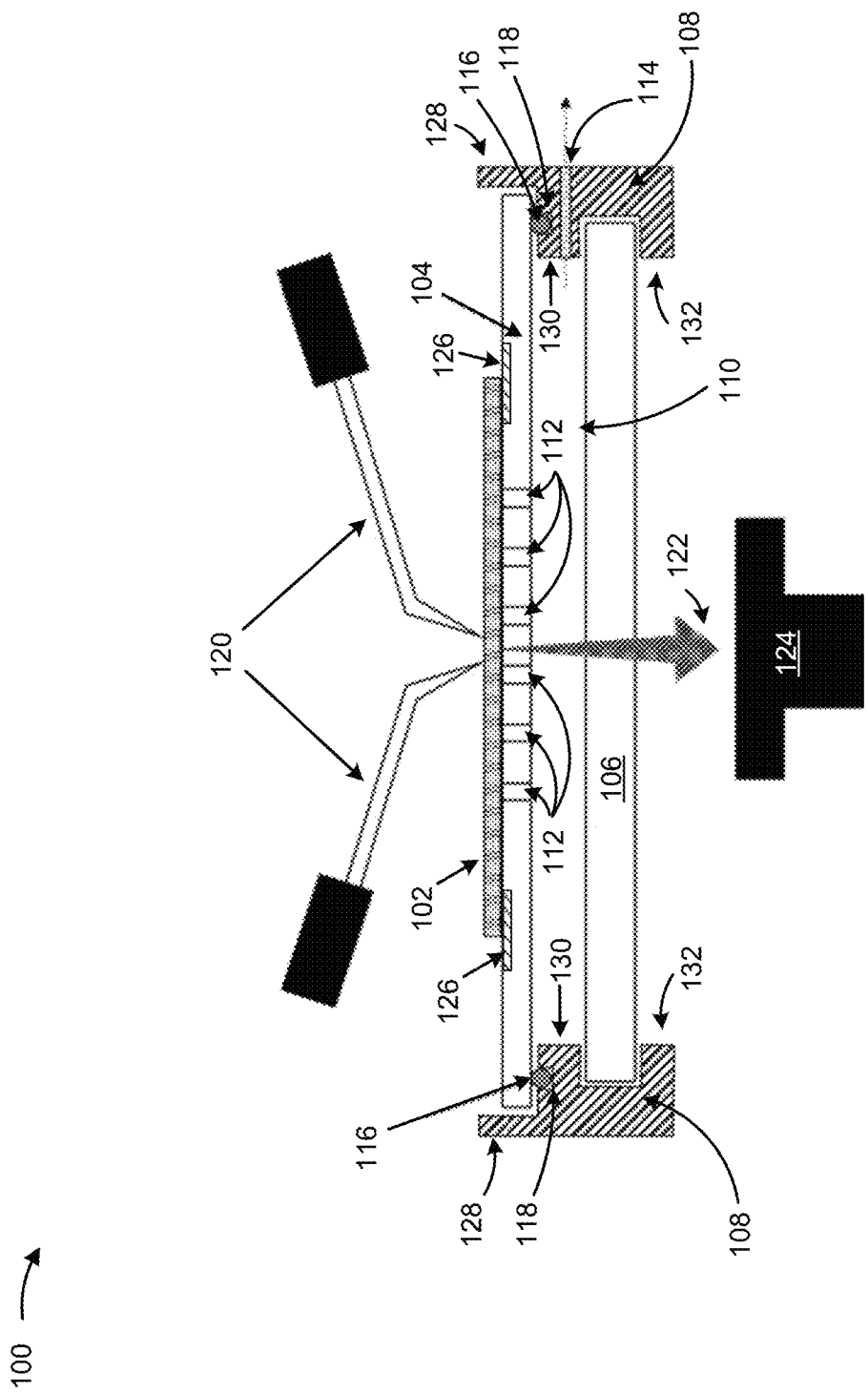
FIG. 1 is a diagram of a cross-sectional view of an example implementation of a testing apparatus, a wafer, including one or more bottom-emitting or bottom-detecting optical devices under test, and a testing device.

The following detailed description of example implementations refers to the accompanying drawings. The same reference numbers in different drawings may identify the same or similar elements.

Testing apparatuses for wafers of top-emitting or top-detecting optical devices secure the wafers by creating a vacuum between an upper metal chuck and a lower metal chuck to provide suction to the wafer through holes in the upper metal chuck and to provide thermal transfer between the chuck and the wafer. The suction may also flatten the wafers to remove bowing. For example, thinned wafers may have much more bowed shape caused by thinning the wafer and/or the like than the bowed shape of thicker wafers (e.g., thinned, but not as thin as thinned wafers. Because the optical devices are top-emitting or top-detecting, the upper metal chuck and lower metal chuck are unlikely to interfere with optical testing (e.g., illumination or optical measurement) of the optical devices in the wafer. However, the upper metal chuck and lower metal chuck may prevent optical testing of bottom-emitting or bottom-detecting optical devices by blocking light to or from the optical devices under test.

Some testing apparatuses for bottom-emitting or bottom-detecting optical devices hold a wafer by an outer edge of the wafer such that a bottom surface of the wafer is not blocked by the testing apparatus. A probe card may be used on a top surface of the wafer to test bottom-emitting or bottom-detecting optical devices on the wafer. However, thin wafers (e.g., having a thickness of between about 50 and 200 microns) and/or large diameter wafers (e.g., having a diameter of between about 4 inches and 6 inches) may break or bend when supported by the outer edge of the wafer and probed from the top surface. Furthermore, such testing apparatuses do not flatten thin wafers to remove bowing. Additionally, as wafers become thinner (e.g., having a thickness of between about 50 and 100 microns) or wafers become larger (e.g., having a larger diameter, increasing bowing even if wafer thickness does not change) with technological development, such testing apparatuses will be unsuitable.

Some implementations described herein provide an apparatus for optical testing of bottom-emitting or bottom-detecting optical devices. The apparatus may include an upper transparent plate (e.g., a transparent wafer carrier), a lower transparent plate, and a structure supporting the upper transparent plate and the lower transparent plate to form a cavity bounded by the upper transparent plate, the lower transparent plate, and the structure. The upper transparent plate may hold a wafer of bottom-emitting or bottom-detecting optical devices, and may include a set of holes in an area for holding the wafer. The structure may include an opening in fluid communication with the cavity. In some implementations, applying a suction (e.g., by a vacuum, pump, or the like) through the opening, via the cavity and the set of holes, holds the wafer flat on the upper transparent plate. In some implementations, an optical path, between a bottom-emitting or bottom-detecting optical device of the bottom-emitting or bottom-detecting optical devices of the wafer and a testing device, passes through the upper transparent plate, the cavity, and the lower transparent plate. In some implementations, the upper transparent plate and the lower transparent plate are transparent at a wavelength for optical testing of the bottom-emitting or bottom-detecting optical devices. In this way, the apparatus may permit optical testing of bottom-emitting or bottom-detecting optical devices on wafers (e.g., thinned wafers, large diameter wafers, and/or the like) without breaking and/or bending the wafers. Additionally, or alternatively, the apparatus may flatten wafers to remove bowing.

FIG. 1 is a diagram of a cross-sectional view of an example implementation 100 of a testing apparatus, a wafer 102, including one or more bottom-emitting or bottom-detecting optical devices under test, and a testing device. In some implementations, the wafer 102 may be a wafer of one or more optical devices (e.g., an optical wafer), and the optical devices may be bottom-emitting and/or bottom-detecting optical devices (e.g., an array of bottom-emitting VCSELs and/or the like). Additionally, or alternatively, the wafer 102 may be a thinned wafer. For example, a plurality of layers may be formed on a substrate to create the one or more optical devices, and a portion of the substrate may be removed (e.g. by grinding or polishing) to form a thinned wafer.

As shown in FIG. 1, the testing apparatus may include an upper transparent plate 104, a lower transparent plate 106, and a structure 108. In some implementations, the upper transparent plate 104 and the lower transparent plate 106 may be transparent to optical wavelengths for testing the wafer 102. For example, if the wafer 102 is to be tested at visible wavelengths, the upper transparent plate 104 and the lower transparent plate 106 may be transparent to visible wavelengths. As another example, if the wafer 102 is to be tested at infrared wavelengths, the upper transparent plate 104 and the lower transparent plate 106 may be transparent to infrared wavelengths. Thus, an optical path may pass through the upper transparent plate 104, the cavity 110, and the lower transparent plate 106.

In some implementations, the upper transparent plate 104 may have a shape (e.g., a circular disc, a square plate, and/or the like) and/or a size (e.g., a diameter, a length, a width, and/or a thickness) based on a shape and/or a size of the wafer 102 and/or the structure 108. For example, the upper transparent plate 104 may have a circular shape for a circular wafer 102. Additionally, or alternatively, the upper transparent plate 104 may have a size that is larger than a size of the wafer 102 (e.g., a diameter, a length, and/or a width of the upper transparent plate 104 may be greater than a diameter, a length, and/or a width of the wafer 102). The upper transparent plate 104 may also have a shape and/or a size such that, when the upper transparent plate 104 is positioned on the structure 108, the structure 108 may support the upper transparent plate 104.

In some implementations, the upper transparent plate 104 may have a shape including a first section based on a shape and/or a size of the wafer 102 and a second section based on the structure 108. For example, the first section (e.g., a wafer-holding section) may have a shape and size configured to hold the wafer 102, and the second section may have a shape and/or a size to interface with the structure 108 such that, when the upper transparent plate 104 is positioned on the structure 108, the structure 108 may support the upper transparent plate 104. In some implementations, the first section and second section may be integral. For example, the first section may have a circular shape configured to hold a circular wafer 102, and the second section may extend from the circular shape of the first section to form one or more structures (e.g., squared corners, support rods, and/or the like) to interface with the structure 108.

In some implementations, the upper transparent plate 106 may have a shape in accordance with a wafer carrier or a shape so that the upper transparent plate 106 can be removed from the structure 108 by a wafer handler.

In some implementations, the lower transparent plate 106 may have a shape (e.g., a circular disc, a square plate, and/or the like) and/or a size (e.g., a diameter, a length, a width, and/or a thickness) based on a shape and/or a size of the structure 108. For example, the lower transparent plate 106 may have a circular shape, a square shape, and/or the like and a diameter, a length, a width, and/or a thickness configured to be supported, by the structure 108 (as shown in FIG. 1), from above (e.g., when applying a vacuum pump as described below).

In some implementations, the upper transparent plate 104 and/or the lower transparent plate 106 may include a material that, as described above, is transparent to wavelengths for optical testing of the wafer 102. In some implementations, the upper transparent plate 104 and/or the lower transparent plate 106 may also include a material having a rigidity (e.g., based on a Young's modulus) to withstand forces applied to the upper transparent plate 104 and/or the lower transparent plate 106 (e.g., by the structure 108) when applying a vacuum pump as described below. Additionally, or alternatively, the material may also have a hardness (e.g., based on a Mohs scale) to withstand scratches, which may impact optical testing of optical devices on the wafer 102. In some implementations, the upper transparent plate 104 and/or the lower transparent plate 106 may include quartz, such as fused silica, sapphire, and/or the like.

In some implementations, the upper transparent plate 104 and/or the lower transparent plate 106 may have a same shape and/or size or a different shape and/or size. For example, the upper transparent plate 104 and the lower transparent plate 106 may be circular discs having the same diameter or different diameters. As another example, the upper transparent plate 104 may be a circular disc, and the lower transparent plate 106 may be a rectangular plate or a square plate.

As shown in FIG. 1, the structure 108 may support the upper transparent plate 104 and the lower transparent plate 106 to form a cavity 110 bounded by the upper transparent plate 104, the lower transparent plate 106, and the structure 108. The upper transparent plate 104 may include a set of holes 112 in an area of the upper transparent plate 104 for holding the wafer 102. In some implementations, the set of holes 112 may be in fluid communication with the cavity 110.

As shown in FIG. 1, the structure 108 may include an opening 114 in fluid communication with the cavity 110. Applying a vacuum pump to the opening 114 may create a suction, via the cavity 110 and the set of holes 112, to hold the wafer 102 on the upper transparent plate 104. In some implementations, the wafer 102 may have a first shape that is a bowed shape when not applying the vacuum pump. For example, if the wafer 102 is a thinned wafer, the wafer 102 may have a bowed shape. The suction, via the cavity 110 and the set of holes 112, may hold the thinned wafer flat on the upper transparent plate 104 (e.g., on a top surface of the upper transparent plate 104), such that the thinned wafer has a second shape that is a flat shape when applying the vacuum pump that is advantageous for testing. As another example, if the wafer 102 is not a thinned wafer, it may still have a bowed shape, perhaps less bowed than a thinned wafer, and the suction, via the cavity 110 and the set of holes 112, may also hold the wafer flat on the upper transparent plate 104 in a manner that is advantageous for testing.

As noted above, holding the wafer 102 flat on the upper transparent plate 104 may be advantageous for testing. In some implementations, holding the wafer 102 flat may facilitate optical testing and/or electrical testing of optical devices on the wafer 102. For example, probe alignment may be more precise, involve less vertical movement, and/or be less likely to cause accidental touching of the wafer 102 when the wafer 102 is held flat on the upper transparent plate 104.

Additionally, or alternatively, when the wafer 102 is held flat on the upper transparent plate 104, optical testing of optical devices on the wafer 102 may be more consistent because the optical devices may be held more uniformly against an upper surface of the upper transparent plate 104. For example, when the wafer 102 has a bowed shape, an inconsistently wide air gap between the optical devices on the wafer 102, an inconsistent angle for optical devices at locations on the wafer 102 (e.g., on an edge of the wafer 102 versus at a center of the wafer 102), and/or the like may impact optical testing of the optical devices.

As shown in FIG. 1, the testing apparatus may include a sealing element 116 (e.g., a gasket, an epoxy joint, and/or the like) positioned between the upper transparent plate 104 and the structure 108. In some implementations, when a vacuum pump is applied to the opening 114, the sealing element 116 may assist forming a seal between the upper transparent plate 104 and the structure 108. As further shown in FIG. 1, the structure 108 may include a groove 118 for receiving the sealing element 116. In some implementations, the groove 118 may maintain positioning of the sealing element 116 in the structure 108 (e.g., if the upper transparent plate 104 is lifted off the structure 108 as described herein with respect to FIG. 2 and/or the like).

In some implementations, the structure 108 may include one or more materials (e.g., aluminum and/or the like) capable of supporting the upper transparent plate 104 and the lower transparent plate 106 while the vacuum pump is applied to the opening 114. For example, the structure 108 may be formed of one or more materials such that the structure 108 is capable of withstanding forces applied to the structure by the upper transparent plate 104 and the lower transparent plate 106 while the vacuum pump is applied to the opening 114.

In some implementations, the structure 108 may have a shape that is reciprocal to the upper transparent plate 104 and/or the lower transparent plate 106. For example, the structure 108 may include a vertical lip 128 configured to prevent the upper transparent plate 104 from moving laterally when the upper transparent plate 104 is positioned on the structure 108 (e.g., as shown in FIG. 1). Additionally, or alternatively, the structure 108 may include an upper tab 130 extending horizontally toward a center of the structure 108, where the upper tab 130 is configured to receive the upper transparent plate 104 such that the upper transparent plate 104 is supported, by the structure 108, from below and toward an outer edge of a bottom surface of the upper transparent plate 104 (e.g., as shown in FIG. 1).

In some implementations, the upper tab 130 may be configured to support the lower transparent plate 106 from above (e.g., when applying a vacuum pump) and toward an outer edge of a top surface of the lower transparent plate 106. For example, and as shown in FIG. 1, the upper tab 130 may be positioned below the upper transparent plate 104 and above the lower transparent plate 106. Additionally, or alternatively, the opening 114 may be formed in the upper tab 130, as shown in FIG. 1. In some implementations, the structure 108 may include a lower tab 132 extending horizontally toward a center of the structure 108, where the lower tab 132 is configured to support the lower transparent plate 106 from below (e.g., when not applying a vacuum pump) and toward an outer edge of a bottom surface of the lower transparent plate 106.

As shown in FIG. 1, one or more probes 120 may be used to test optical devices on the wafer 102 to apply one or more electrical signals and cause the optical devices under test to emit light 122, and a testing device 124 may receive the light 122. Alternatively, the probes 120 may be used to test an optical device on the wafer 102 and receive one or more electrical signals in response to the optical device under test receiving light from testing device 124. Any number of probes 120 may be provided as needed for top side contacting optical devices on the wafer under test. As described herein, the upper transparent plate 104 and the lower transparent plate 106 may be transparent to optical wavelengths for testing the wafer 102 such that an optical path may pass through the upper transparent plate 104, the cavity 110, and the lower transparent plate 106. As shown in FIG. 1, the light 122 may travel on the optical path from an optical device under test on the wafer 102 to the testing device 124.

As shown in FIG. 1, the testing device 124 may be positioned below the lower transparent plate 106. In some implementations, the testing device 124 may receive (e.g., detect) the light 122 traveling on the optical path through the upper transparent plate 104 and the lower transparent plate 106. Additionally, or alternatively, the wafer 102 may include one or more bottom-detecting optical devices, and the testing device 124 may provide (e.g., emit) light on the optical path through the lower transparent plate 106 and the upper transparent plate 104. In some implementations, the testing device 124 may include one or more photodetectors, one or more light sources (e.g., a halogen light, an incandescent light, a compact fluorescent (CFL) light, a laser, a light emitting diode (LED), a florescent light, a neon light, arrays of any of the proceeding light sources, and/or the like), one or more emitters, one or more beam splitters, one or more optical elements, and/or the like. For example, the testing device 124 may be a large area detector (e.g., to capture all the light emitted from an optical device under test, even with distortion).

In some implementations, when the upper transparent plate 104 is holding the wafer 102, one or more holes of the set of holes 112 may align with one or more test areas on the wafer 102 instead of aligning or overlapping in some way with an optical device under test on the wafer 102. For example, the wafer 102 may include one or more test areas (e.g., non-optical areas) that are associated with testing when forming the wafer 102, and one or more holes of the set of holes 112 may align with the one or more test areas, rather than aligning with one or more of the optical devices under optical test on the wafer 102. The one or more holes of the set of holes 112 may be positioned in the upper transparent plate 104 such that, when tested, the optical devices on the wafer 102 may emit light 122 through the upper transparent plate 104, rather than through one or more of the holes of the set of holes 112. In this way, the one or more holes of the set of holes 112 may be positioned in the upper transparent plate 104 to ensure that light 122 from the optical devices on the wafer 102 has passed along an optical path that includes the upper transparent plate 104, or excludes a hole of the upper transparent plate 104, before reaching the testing device 124, which may facilitate uniform testing conditions for the optical devices on the wafer 102.

In some implementations, when the upper transparent plate 104 is holding the wafer 102, one or more holes of the set of holes 112 may align with one or more optical devices on the wafer 102. For example, the one or more holes of the set of holes 112 may be positioned in the upper transparent plate 104 such that, when tested, the optical devices on the wafer 102 may emit light 122 through one or more of the holes of the set of holes 112, rather than the upper transparent plate 104. In this way, the one or more holes of the set of holes 112 may be positioned in the upper transparent plate 104 to ensure that light 122 from the optical devices on the wafer 102 has passed along an optical path that includes a hole of the set of holes 112 before reaching the testing device 124, which may facilitate uniform testing conditions for the optical devices on the wafer 102.

In some implementations, the one or more holes of the set of holes 112 may not all align with one or more test areas on the wafer 102 or one or more optical devices on the wafer 102. For example, a first group of the set of holes 112 may align with one or more test areas on the wafer 102 or one or more optical devices on the wafer 102, and a second group of the set of holes 112 may not align with one or more test areas on the wafer 102 or one or more optical devices on the wafer 102. In other words, an optical path for each of the optical devices on the wafer 102 may or may not include the upper transparent plate 104, thereby creating non-uniform testing conditions for the optical devices on the wafer 102. In such implementations, the testing device 124 may be configured to determine that the optical devices were tested under non-uniform conditions and to apply an offset to test results for the optical devices based on the non-uniform conditions. Aligning the set of holes 112 and the optical devices under test on the wafer 102 so as to avoid an optical path that passes partially through a hole of the upper transparent plate 104 may also facilitate greater uniformity in optical testing conditions.

In some implementations, one or more holes of the set of holes 112 may be positioned in a pattern in the upper transparent plate 104. For example, the set of holes 112 may form two or more concentric circle patterns (e.g., from a center of the upper transparent plate 104 toward an outer edge of the upper transparent plate 104).

In some implementations, and as shown in FIG. 1, two or more probes 120 (e.g., using a probe card) may be used if both a cathode (or n contact) and an anode (or p contact) are on a top surface of one or more optical devices on the wafer 102. In such a case, an electrical path to drive emission of light 122 from the optical devices may be completed by contacting tips of the two probes 120 against two electrodes on a top surface of the one or more optical devices (e.g., corresponding to the cathode and the anode, or vice versa).

Additionally, or alternatively, the upper transparent plate 104 may include a conducting element 126 on an upper surface of the upper transparent plate 104 to provide an electrical path from a bottom surface of the wafer 102 to a top surface of the wafer 102. For example, the electrical path may be completed by touching a tip of a probe 120 to an electrode on a top surface of one or more optical devices on the wafer 102 while the bottom or substrate of the wafer 102 is suctioned against the conducting element 126 on the upper surface of the upper transparent plate 104. In some implementations, the conducting element 126 may be a layer of electrically conducting material (e.g., gold, silver, and/or the like) in a shape of a ring that contacts an outer radius of the wafer 102 outside of the optical path through the upper transparent plate 104.

In some implementations, the upper transparent plate 104 may include one or more securing elements to mechanically secure the wafer 102 to an upper surface of the upper transparent plate 104. For example, the one or more securing elements may include one or more clips, clamps, adhesives, tape, temporary bonding, and/or the like. In some implementations, the one or more securing elements may prevent the wafer 102 from moving on and/or sliding off the upper surface of the upper transparent plate 104 (e.g., while the upper transparent plate 104 and the wafer 102 are being moved, being placed on the structure 108, and/or the like). In some implementations, the one or more securing elements maintain alignment of the wafer 102 and the set of holes 112.

In some implementations, a top and/or bottom surface of the upper transparent plate 104, and/or the lower transparent plate 106 may include an anti-reflective coating. The anti-reflective coating may prevent some or any back reflection along the optical path (e.g., of the light 122). Reducing back reflection of the light 122 may reduce noise in a light output measurement taken by the testing device 124. In some implementations, the top surface of the lower transparent plate 106 may include an anti-reflective coating to prevent the light 122 from reflecting off the lower transparent plate 106 back up to the upper transparent plate 104. Additionally, or alternatively, the bottom surface of the upper transparent plate 104 may include an anti-reflective coating to prevent any light reflected off the top surface of the lower transparent plate 106 from reflecting again off the bottom surface of the upper transparent plate 104. Additionally, or alternatively, the bottom surface of the lower transparent plate 106 may include an anti-reflective coating to prevent ambient light from reflecting off the lower transparent plate 106 to the testing device 124.

In some implementations, and as shown in FIG. 1, the upper transparent plate 104 and the lower transparent plate 106 may be parallel. However, in some implementations, the upper transparent plate 104 and the lower transparent plate 106 may not be parallel. For example, the upper transparent plate 104 and the lower transparent plate 106 may have an angular offset with respect to each other (e.g., a few degrees). In some implementations, a non-parallel orientation of the upper transparent plate 104 and the lower transparent plate 106 may reduce and/or eliminate back reflections (e.g., of the light 122) on the optical path.

In some implementations, the upper transparent plate 104 may also function as wafer carrier. For example, the upper transparent plate 104 may be a transparent wafer carrier and may be removably supported by the structure 108 such that the transparent wafer carrier (e.g., holding the wafer 102) may be lifted off the structure 108 without touching the wafer 102. When the upper transparent plate 104 is also a transparent wafer carrier, the bottom (emitting or detecting) surface of the wafer 102 is subject to fewer transfers between surfaces which reduces the likelihood of scratches, other defects, and/or wafer breakage during processing, handling, and testing. When the upper transparent plate 104 is also a transparent wafer carrier, the structure 108 may be configured so as to directly receive the transparent wafer carrier from a handler 222 (shown in FIG. 2). In some implementations, the upper transparent plate 104 functioning as a transparent wafer carrier may enable a combination of the upper transparent plate 104 and the wafer 102 to be stackable in a multi-wafer cassette carrier (e.g., that may be commonly used in semiconductor fabrication facilities). Additionally, or alternatively, the upper transparent plate 104 functioning as a transparent wafer carrier may enable an automatic wafer handler to lift and transfer the combination of the upper transparent plate 104 and the wafer 102 from the multi-wafer cassette carrier onto the apparatus, the structure 108, and/or the like.

In some implementations, the upper transparent plate 104 may include one or more support elements on the bottom surface of the upper transparent plate 104. For example, the upper transparent plate 104 may be a transparent wafer carrier including one or more support elements positioned outside of an area for holding the wafer 102 and/or outside of the optical path (e.g., on a perimeter, outer edge, and/or the like of the transparent wafer carrier) and, when the transparent wafer carrier is placed on a surface, the one or more support elements may prevent a bottom surface of the transparent wafer carrier from contacting the surface.

In some implementations, the upper transparent plate 104 and/or the lower transparent plate 106 may be formed of a material (e.g., quartz, sapphire, and/or the like) and may have a thickness configured to withstand forces applied, by the structure, to the upper transparent plate 104 and the lower transparent plate 106 while the vacuum pump is applied to the opening 114. The thickness may alternatively or additionally be configured to reduce the optical loss on the optical path through the upper transparent plate 104 and/or the lower transparent plate 106. In some implementations, the upper transparent plate 104 may have a thickness between 1 mm and 5 mm and the lower transparent plate 104 may have a thickness between 1 mm and 5 mm. In some implementations, when quartz is used and to prevent fragility and/or cracking under vacuum, the quartz may be thicker than when sapphire is used. Additionally, or alternatively, the upper transparent plate 104 and/or the lower transparent plate 106 may be formed of a material having a thermal conductivity to accommodate thermal transfer between the optical devices under test on the wafer 102 and the testing apparatus. For example, the upper transparent plate 104 and/or the lower transparent plate 106 may be formed of a material having a thermal conductivity of between 0.5 and 34.6 W/(m·K). In some implementations, as compared to quartz, sapphire may have a higher thermal conductivity, be used to form a thinner upper transparent plate 104 and/or a thinner lower transparent plate 106, be more robust, and/or the like.

As indicated above, FIG. 1 is provided merely as an example. Other examples may differ from what is described with regard to FIG. 1.

Figure 2:
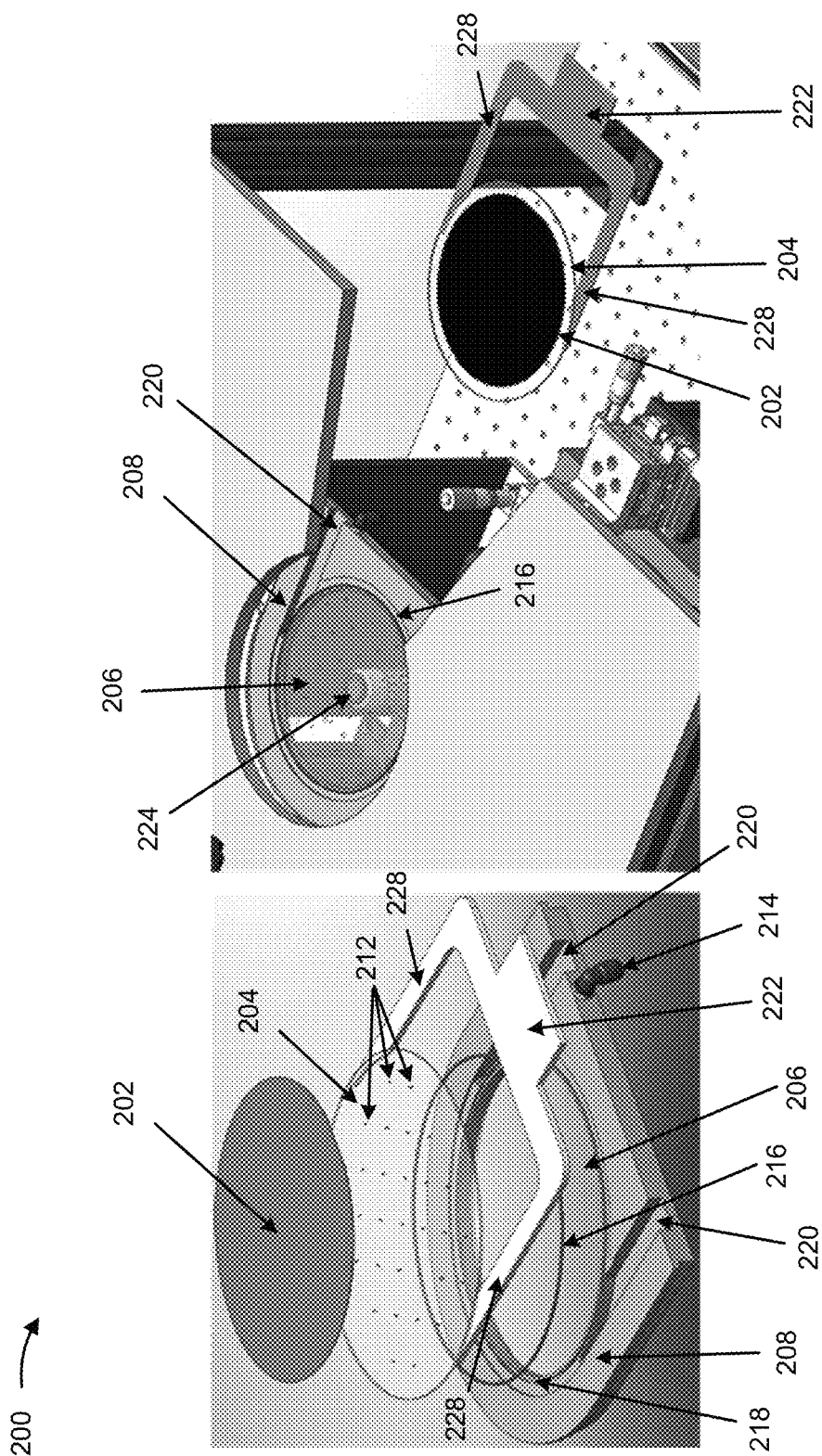
FIG. 2 is a diagram of an exploded perspective view of an example implementation of a testing apparatus, a wafer, and a handler and a perspective view of the handler transporting a portion of the testing apparatus.

FIG. 2 is a diagram of an exploded perspective view of an example implementation 200 of a testing apparatus, a wafer 202, and a handler 222 and a perspective view of the handler 222 transporting a portion of the testing apparatus. As shown in FIG. 2, the testing apparatus may include an upper transparent plate 204, a lower transparent plate 206, and a structure 208. In some implementations, the upper transparent plate 204, the lower transparent plate 206, and the structure 208 may be similar to the upper transparent plate 104, the lower transparent plate 106, and the structure 108, respectively, as described herein with respect to FIG. 1. For example, the upper transparent plate 204 may include a set of holes 212, and the structure 208 may support the upper transparent plate 204 and the lower transparent plate 206 to form a cavity 210 (shown in FIG. 3) bounded by the upper transparent plate 204, the lower transparent plate 206, and the structure 208.

As shown in FIG. 2, the testing apparatus may include an outlet 214 positioned on an exterior of the structure 208. The outlet 214 may be in fluid communication with an opening 226 (shown in FIG. 3) in the structure 208, and the opening 226 may be in fluid communication with the cavity 210 (shown in FIG. 3) bounded by the upper transparent plate 204, the lower transparent plate 206, and the structure 208. In some implementations, the outlet 214 may facilitate connection to a device that may apply a vacuum pump to the outlet 214 to create a suction, via the opening 226, the cavity 210, and the set of holes 212 to hold and/or flatten the wafer 102 on the upper transparent plate 204.

As shown in FIG. 2, the testing apparatus may include a sealing element 216, and the structure 208 may include a groove 218 for receiving the sealing element 216. In some implementations, the sealing element 216 and the groove 218 may be similar to the sealing element 116 and the groove 118, respectively, as described herein with respect to FIG. 1.

As shown in FIG. 2, the structure 208 may include channels 220. In some implementations, the channels 220 may be configured to receive one or more arms 228 of the handler 222 (e.g., an automatic wafer handler and/or the like), such that one or more portions of the one or more arms 228 may be positioned under an outer edge of the upper transparent plate 204.

In some implementations, and as shown in the perspective view on a right side of FIG. 2, when the one or more arms 228 of the handler 222 are positioned under the upper transparent plate 204 and the handler 222 is lifted, the handler 222 may lift, off the testing apparatus, the upper transparent plate 204 holding the wafer 202 and transport the upper transparent plate 204 holding the wafer 202 (e.g., to another testing device, to a multi-wafer cassette carrier, and/or the like) whereby the upper transparent plate 204 may be, and/or function as, a transparent wafer carrier.

In some implementations, and as also shown in the perspective view on the right side of FIG. 2, the testing apparatus may include a testing device 224. In some implementations, the testing device 224 may be similar to the testing device 124 as described herein with respect to FIG. 1. For example, the testing device 224 may be positioned below the lower transparent plate 206, and, when the wafer 202 and the upper transparent plate 204 are positioned on the testing apparatus, light may travel on an optical path from the wafer 202 to the testing device 224 and/or from the testing device 224 to the wafer 202.

As indicated above, FIG. 2 is provided merely as an example. Other examples may differ from what is described with regard to FIG. 2.

Figure 3:
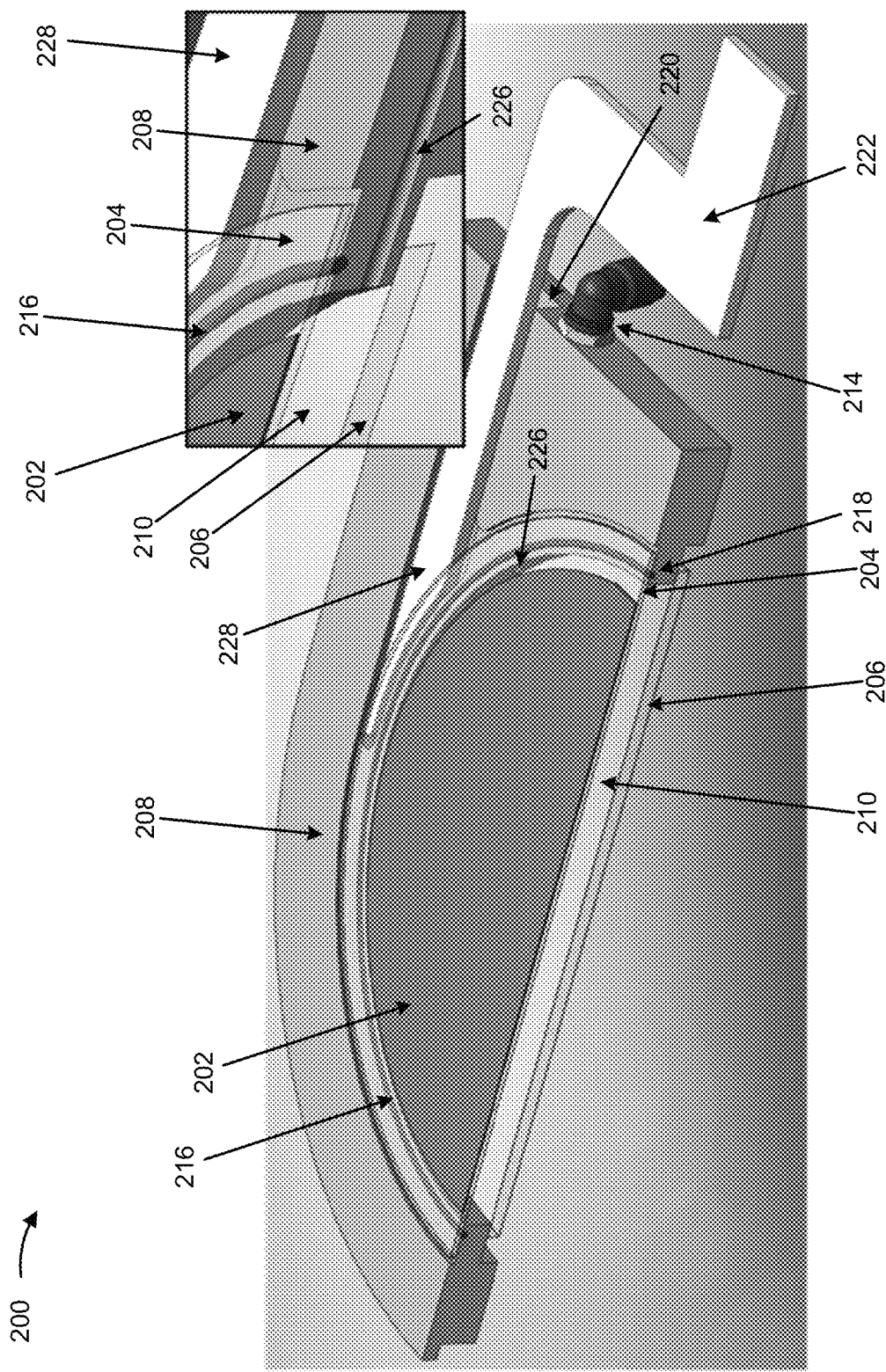
FIG. 3 is a diagram of a perspective view of two cross-sections of the example implementation of the testing apparatus, the wafer, and the handler of FIG. 2.

FIG. 3 is a diagram of a perspective view of two cross-sections of the example implementation 200 of the testing apparatus, the wafer 202, and the handler 222 of FIG. 2. As shown in FIG. 3, the structure 208 may support the upper transparent plate 204 and the lower transparent plate 206 to form the cavity 210 bounded by the upper transparent plate 204, the lower transparent plate 206, and the structure 208. As also shown in FIG. 3, the structure 208 may include the opening 226, and the opening 226 may be in fluid communication with the cavity 210. As shown in FIG. 3, the structure 208 may include a channel 220 configured to receive an arm 228 of the handler 222 (e.g., an arm of the handler 222), such that one or more portions of the arm 228 may be positioned under an outer edge of the upper transparent plate 204.

As indicated above, FIG. 3 is provided merely as an example. Other examples may differ from what is described with regard to FIG. 3.

Figure 4:
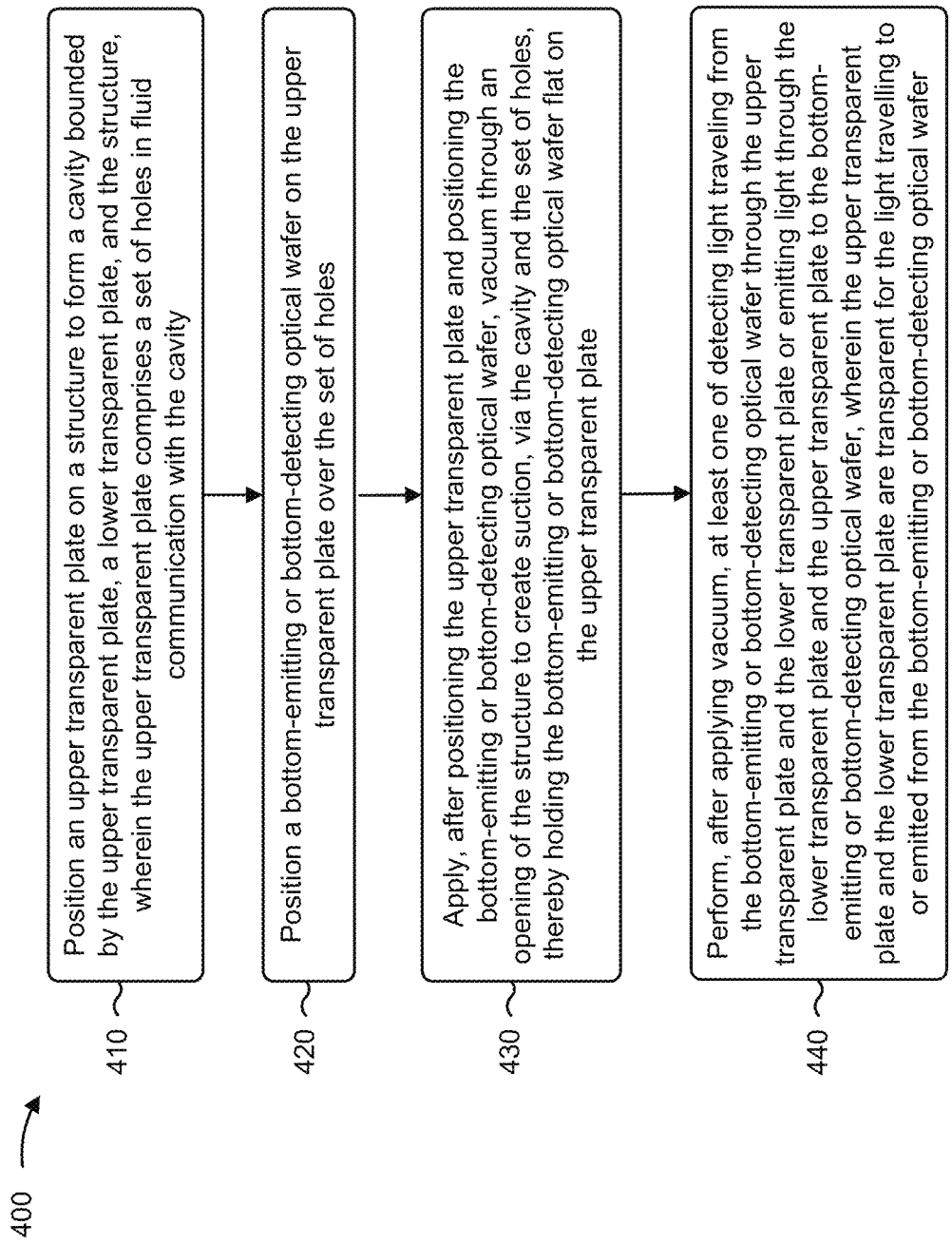
FIG. 4 is a flowchart of an example process for optical testing of a bottom-emitting and/or bottom-detecting optical device using a testing apparatus.

FIG. 4 is a flowchart of an example process 400 for optical testing of a bottom-emitting and/or bottom-detecting optical device using a testing apparatus.

In some implementations, one or more process blocks of FIG. 4 may be performed by a testing apparatus. In some implementations, one or more process blocks of FIG. 4 may be performed by another device or a group of devices separate from or including the testing apparatus, such as one or more probes (e.g., probes 120), a handler (e.g., handler 222), a testing device (e.g., testing device 124, testing device 224, and/or the like), and/or the like.

As shown in FIG. 4, process 400 may include positioning an upper transparent plate on a structure to form a cavity bounded by the upper transparent plate, a lower transparent plate, and the structure, wherein the upper transparent plate comprises a set of holes in fluid communication with the cavity (block 410). For example, a handler (e.g., handler 222) may position an upper transparent plate on a structure to form a cavity bounded by the upper transparent plate, a lower transparent plate, and the structure, as described above. In some implementations, the upper transparent plate comprises a set of holes in fluid communication with the cavity.

As further shown in FIG. 4, process 400 may include positioning a bottom-emitting or bottom-detecting optical wafer on the upper transparent plate over the set of holes (block 420). For example, a handler (e.g., handler 222) may position the bottom-emitting or bottom-detecting optical wafer on the upper transparent plate over the set of holes.

As further shown in FIG. 4, process 400 may include applying, after positioning the upper transparent plate and positioning the bottom-emitting or bottom-detecting optical wafer, vacuum through an opening of the structure to create suction, via the cavity and the set of holes, thereby holding the bottom-emitting or bottom-detecting optical wafer flat on the upper transparent plate (block 430). For example, the testing apparatus (e.g., using a vacuum pump and/or the like) may apply, after positioning the upper transparent plate and positioning the bottom-emitting or bottom-detecting optical wafer, vacuum through an opening of the structure to create suction, via the cavity and the set of holes, thereby holding the bottom-emitting or bottom-detecting optical wafer flat on the upper transparent plate, as described above.

As further shown in FIG. 4, process 400 may include performing, after applying vacuum, at least one of detecting light traveling from the bottom-emitting or bottom-detecting optical wafer through the upper transparent plate and the lower transparent plate, or emitting light through the lower transparent plate and the upper transparent plate to the bottom-emitting or bottom-detecting optical wafer, wherein the upper transparent plate and the lower transparent plate are transparent for the light travelling to, or emitted from, the bottom-emitting or bottom-detecting optical wafer (block 440). For example, the testing apparatus (e.g., using a testing device, such as testing device 124 and/or testing device 224, and/or the like) may perform, after applying vacuum, at least one of receiving (e.g., detecting) light traveling from the bottom-emitting or bottom-detecting optical wafer through the upper transparent plate and the lower transparent plate or providing (e.g., emitting) light through the lower transparent plate and the upper transparent plate to the bottom-emitting or bottom-detecting optical wafer, as described above. In some implementations, the upper transparent plate and the lower transparent plate are transparent for the light travelling to or emitted from the bottom-emitting or bottom-detecting optical wafer.

Process 400 may include additional implementations, such as any single implementation or any combination of implementations described below and/or in connection with one or more other processes described elsewhere herein.

In a first implementation, process 400 includes securing (e.g. mechanically securing) the bottom-emitting or bottom-detecting optical wafer to the upper transparent plate.

In a second implementation, alone or in combination with the first implementation, process 400 includes removing the upper transparent plate with the bottom-emitting or bottom-detecting optical wafer secured to the upper transparent plate.

In a third implementation, alone or in combination with one or more of the first and second implementations, process 400 includes causing a bottom-emitting or bottom-detecting optical device of the optical wafer to emit light through the upper transparent plate and the lower transparent plate.

In a fourth implementation, alone or in combination with one or more of the first through third implementations, positioning the optical wafer on the upper transparent plate over the set of holes comprises positioning the bottom-emitting or bottom-detecting optical wafer in a non-flat (e.g., bowed) position on the upper transparent plate while not applying vacuum through the opening of the structure.

In a fifth implementation, alone or in combination with one or more of the first through fourth implementations, positioning the optical wafer on the upper transparent plate over the set of holes comprises positioning the bottom-emitting or bottom-detecting optical wafer relative to the set of holes such that optical devices under test on the bottom-emitting or bottom-detecting optical wafer do not align with the set of holes.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

Any of the implementations described herein may be combined unless the foregoing disclosure expressly provides a reason one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper" and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An apparatus, comprising:
    an upper transparent plate to support a wafer of an optical device,
        wherein the upper transparent plate comprises at least one hole;
    a lower transparent plate; and
    a structure supporting the upper transparent plate and the lower transparent plate to form a cavity bounded by the upper transparent plate, the lower transparent plate, and the structure,
        wherein the cavity is in fluid communication with the at least one hole,
        wherein the structure comprises an opening in fluid communication with the cavity, and
        wherein, when a suction force is applied through the opening, the wafer is held onto the upper transparent plate.

2. The apparatus of claim 1, wherein the upper transparent plate and the lower transparent plate are transparent at an optical wavelength for testing the wafer.

3. The apparatus of claim 1, wherein the upper transparent plate comprises a conducting element on an upper surface of the upper transparent plate to provide an electrical path from a bottom surface of the wafer to a top surface of the wafer.

4. The apparatus of claim 1, wherein at least one of the upper transparent plate or the lower transparent plate comprises an anti-reflective coating.

5. The apparatus of claim 1, wherein the upper transparent plate is parallel to the lower transparent plate.

6. The apparatus of claim 1, further comprising:
    a testing device positioned below the lower transparent plate,
        wherein the testing device is to receive light traveling on an optical path through the upper transparent plate and the lower transparent plate or to provide light on the optical path through the lower transparent plate and the upper transparent plate.

7. The apparatus of claim 6, wherein the testing device comprises at least one of a photodetector, a light source, or a beam splitter.

8. An apparatus, comprising:
    an upper plate to support a wafer of a bottom-emitting or bottom-detecting optical device;

a lower plate,
  wherein the lower plate and the upper plate are transparent at a wavelength for testing the bottom-emitting or bottom-detecting optical device; and
a structure supporting the upper plate and the lower plate,
  wherein the upper plate, the lower plate, and the structure are configured to allow a suction force to act on a bottom surface of the wafer to hold the wafer flat against an upper surface of the upper plate.

9. The apparatus of claim 8, wherein the suction force is to act on to the bottom surface of the wafer via an opening in the structure, a cavity between the upper plate and the lower plate, and at least one hole in the upper plate.

10. The apparatus of claim 8, further comprising:
  a sealing element positioned between the upper plate and the structure to form a seal between the upper plate and the structure when the suction force is applied.

11. The apparatus of claim 10, wherein the sealing element comprises at least one of a gasket or an epoxy joint.

12. The apparatus of claim 8, wherein the upper plate and the lower plate are made of at least one of sapphire or quartz.

13. The apparatus of claim 8, wherein the structure comprises:
  an upper tab for supporting the upper plate; and
  a lower tab for supporting the lower plate.

14. The apparatus of claim 8, wherein the structure comprises:
  a vertical lip configured to prevent lateral movement of the upper plate relative to the structure.

15. A method, comprising:
positioning an upper transparent plate on a structure to form a cavity bounded by the upper transparent plate, a lower transparent plate, and the structure,
  wherein the upper transparent plate comprises at least one hole in fluid communication with the cavity;
positioning an optical wafer on the upper transparent plate over the at least one hole; and
applying a suction force through an opening of the structure to act on the optical wafer via the cavity and the at least one hole, thereby holding the optical wafer flat on the upper transparent plate.

16. The method of claim 15, further comprising:
detecting light traveling from the optical wafer through the upper transparent plate and the lower transparent plate.

17. The method of claim 15, further comprising:
emitting light through the lower transparent plate and the upper transparent plate to the optical wafer.

18. The method of claim 15, wherein positioning the optical wafer on the upper transparent plate over the at least one hole comprises positioning the optical wafer in a non-flat position on the upper transparent plate.

19. The method of claim 15, wherein positioning the optical wafer on the upper transparent plate over the at least one hole comprises positioning the optical wafer relative to the at least one hole such that optical devices on the optical wafer do not align with the at least one hole.

20. The method of claim 15, wherein the at least one hole comprises concentric holes.

* * * * *